US008872307B2

(12) United States Patent
Nakai

(10) Patent No.: US 8,872,307 B2
(45) Date of Patent: Oct. 28, 2014

(54) P-TYPE SILICON SINGLE CRYSTAL AND METHOD OF MANUFACTURING THE SAME

(75) Inventor: Katsuhiko Nakai, Yamaguchi (JP)

(73) Assignee: Siltronic AG, Munich (DE)

( * ) Notice: Subject to any disclaimer, the term of this patent is extended or adjusted under 35 U.S.C. 154(b) by 161 days.

(21) Appl. No.: 13/610,940

(22) Filed: Sep. 12, 2012

(65) Prior Publication Data

US 2013/0093058 A1    Apr. 18, 2013

(30) Foreign Application Priority Data

Oct. 17, 2011    (JP) .................. 2011-227861

(51) Int. Cl.
*H01L 29/72* (2006.01)
*C30B 15/04* (2006.01)
*C30B 29/06* (2006.01)

(52) U.S. Cl.
CPC .................. *C30B 29/06* (2013.01); *C30B 15/04* (2013.01)
USPC ............................................ 257/607; 117/21

(58) Field of Classification Search
CPC ....................................................... C30B 15/04
USPC ............................................. 257/607; 117/21
See application file for complete search history.

(56) References Cited

U.S. PATENT DOCUMENTS

| 2007/0056504 | A1 | 3/2007 | Lim | |
| 2009/0026423 | A1 | 1/2009 | Kirscht et al. | |
| 2010/0288184 | A1 | 11/2010 | Ono et al. | |
| 2011/0030793 | A1 | 2/2011 | Kraiem et al. | |
| 2012/0056135 | A1* | 3/2012 | DeLuca et al. | 252/512 |
| 2012/0217446 | A1* | 8/2012 | Anttila et al. | 252/500 |

FOREIGN PATENT DOCUMENTS

| FR | 2929960 A1 | 10/2009 |
| JP | 61-067372 A | 10/1987 |
| JP | 2004307305 A | 11/2004 |
| JP | 2010-531805 A | 9/2010 |

* cited by examiner

*Primary Examiner* — Edward Wojciechowicz
(74) *Attorney, Agent, or Firm* — Brooks Kushman P.C.

(57) ABSTRACT

Silicon wafers having a resistivity >6 Ωcm and axially uniform resistivity are grown by the Czochralski method from a melt containing boron as the main dopant, an n-type first sub-dopant with a segregation coefficient lower than boron, and a p-type second sub-dopant with a segregation coefficient lower than the first sub-dopant.

23 Claims, 2 Drawing Sheets

P-TYPE SILICON SINGLE CRYSTAL AND METHOD OF MANUFACTURING THE SAME

CROSS-REFERENCE TO RELATED APPLICATIONS

This application claims priority to Japanese Patent Application No. 2011-227861 filed Oct. 17, 2011, which is herein incorporated by reference.

BACKGROUND OF THE INVENTION

1. Field of the Invention

The present invention relates to a p-type silicon single crystal and a method of manufacturing the same, and particularly to a p-type silicon single crystal manufactured with a Czochralski method and a method of manufacturing the same.

2. Background Art

A power device such as an IGBT (Insulated Gate Bipolar Transistor) has been widely used recently in home appliances, industrial machines, and the like. One of the primary characteristics of the power device is a high breakdown voltage, and substrates used for power devices in order to achieve this are required to be high in resistivity with a small variation thereof.

Silicon single crystals used for substrates for power devices are generally manufactured by the Czochralski method ("CZ" method). With the CZ method, since the segregation coefficient of dopants such as boron and phosphorus with respect to the silicon single crystal is less than 1, the dopant concentration in the silicon melt becomes greater as the silicon single crystal grows. Therefore, the dopant concentration in the grown silicon single crystal varies in the direction of the axis of growth, and consequently, the resistivity of the silicon single crystal also varies in the direction of the axis of growth. Thus, it has been difficult to control resistivity.

Regarding a technique for controlling resistivity of a single crystal, for example, Japanese National Patent Publication No. 2010-531805 describes a method for controlling resistivity of a silicon ingot used for manufacturing a solar cell. With this method, a silicon ingot is formed by preparing a metallurgical-grade silicon source material containing boron and phosphorus and adding aluminum or the like to metallurgical-grade silicon to fabricate a silicon melt. In this method, metallurgical-grade silicon containing a large amount of impurities is used as a silicon source material. Therefore, a resultant silicon single crystal substrate has resistivity as low as approximately 5 Ωcm or lower and it has been difficult to employ such a substrate for a power device required to have a high breakdown voltage.

In addition, in the metallurgical-grade silicon source material above, boron and phosphorus are originally contained in the silicon source material. Then, the amount of boron and phosphorus is determined and a group III element is mainly added in accordance with the desired amount of boron and phosphorus. Thus, since one type of element is mainly used as an element for controlling resistivity, it has been virtually impossible to reduce the variation in resistivity of the silicon single crystal substrate.

SUMMARY OF THE INVENTION

The present invention was made in view of the above-described problems, and an object thereof is to provide a p-type silicon single crystal high in resistivity with reduced variation in resistivity, and a method of manufacturing the same. These and other objects are surprisingly and unexpectedly achieved by a method of manufacturing a p-type silicon single crystal in which a silicon melt to which boron as a main dopant, a first sub-dopant which is an n-type impurity and smaller in segregation coefficient than boron, and a second sub-dopant which is a p-type impurity and smaller in segregation coefficient than the first sub-dopant have been added. A silicon single crystal having a resistivity not less than 6 Ωcm is grown from the silicon melt by a Czochralski method. Here, the segregation coefficient refers to a segregation coefficient with respect to a silicon single crystal. By thus using a plurality of sub-dopants, a p-type silicon single crystal high in resistivity and less in variation in resistivity can be obtained.

DETAILED DESCRIPTION OF THE PREFERRED EMBODIMENT(S)

Figure 1:
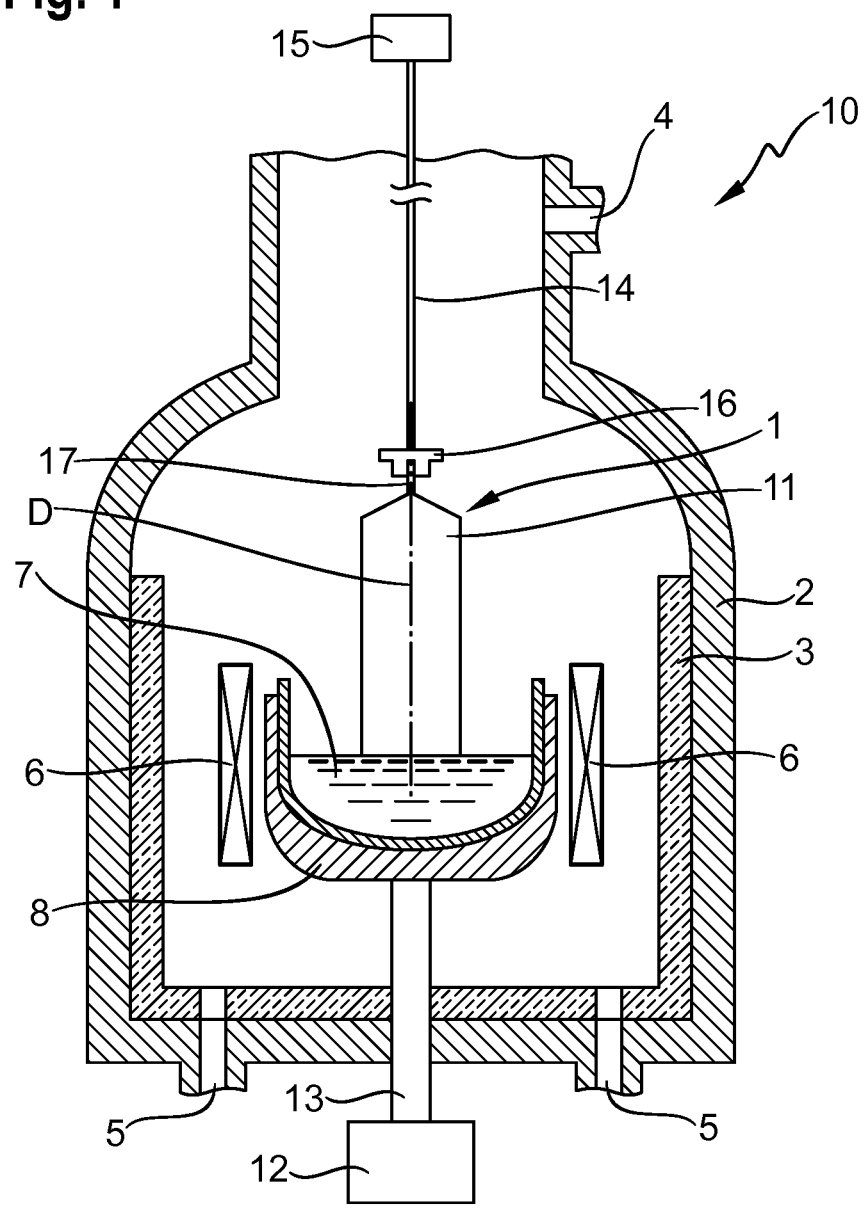
FIG. 1 is a schematic construction diagram showing an apparatus for manufacturing a p-type silicon single crystal.

In one embodiment for manufacturing a p-type silicon single crystal, preferably, the first sub-dopant is phosphorus and the second sub-dopant is aluminum. A first concentration ratio calculated by dividing the concentration of the first sub-dopant in the silicon melt by the concentration of the main dopant in the silicon melt is not lower than 0.5 and not higher than 1.2. A second concentration ratio calculated by dividing the concentration of the second sub-dopant in the silicon melt by the concentration of the main dopant in the silicon melt is not lower than 4.9 and not higher than 52.4. The concentration in the silicon melt refers to the concentration in the initial silicon melt before growth of the silicon single crystal.

In a further embodiment of manufacturing a p-type silicon single crystal above, preferably, the first sub-dopant is phosphorus and the second sub-dopant is gallium. A first concentration ratio calculated by dividing the concentration of the first sub-dopant in the silicon melt by the concentration of the main dopant in the silicon melt is not lower than 0.5 and not higher than 1.2. A second concentration ratio calculated by dividing the concentration of the second sub-dopant in the silicon melt by the concentration of the main dopant in the silicon melt is not lower than 1.2 and not higher than 13.4.

In a yet further method of manufacturing a p-type silicon single crystal above, preferably, the first sub-dopant is phosphorus and the second sub-dopant is indium. A first concentration ratio calculated by dividing the concentration of the first sub-dopant in the silicon melt by the concentration of the main dopant in the silicon melt is not lower than 0.5 and not higher than 1.2. A second concentration ratio calculated by dividing the concentration of the second sub-dopant in the silicon melt by the concentration of the main dopant in the silicon melt is not lower than 25.1 and not higher than 261.2.

In a still yet further embodiment of manufacturing a p-type silicon single crystal above, preferably, the first sub-dopant is arsenic and the second sub-dopant is aluminum. A first concentration ratio calculated by dividing the concentration of the first sub-dopant in the silicon melt by the concentration of the main dopant in the silicon melt is not lower than 0.6 and not higher than 1.5. A second concentration ratio calculated by dividing the concentration of the second sub-dopant in the silicon melt by the concentration of the main dopant in the silicon melt is not lower than 11.7 and not higher than 72.2.

In a still yet further embodiment for manufacturing a p-type silicon single crystal above, preferably, the first sub-dopant is arsenic and the second sub-dopant is gallium. A first concentration ratio calculated by dividing the concentration of the first sub-dopant in the silicon melt by the concentration of the main dopant in the silicon melt is not lower than 0.6 and not higher than 1.5. A second concentration ratio calculated by dividing the concentration of the second sub-dopant in the silicon melt by the concentration of the main dopant in the silicon melt is not lower than 3.1 and not higher than 18.3.

In another embodiment for manufacturing a p-type silicon single crystal above, preferably, the first sub-dopant is arsenic and the second sub-dopant is indium. A first concentration ratio calculated by dividing the concentration of the first sub-dopant in the silicon melt by the concentration of the main dopant in the silicon melt is not lower than 0.6 and not higher than 1.4. A second concentration ratio calculated by dividing the concentration of the second sub-dopant in the silicon melt by the concentration of the main dopant in the silicon melt is not lower than 57.9 and not higher than 324.0.

In another embodiment for manufacturing a p-type silicon single crystal above, preferably, the first sub-dopant is phosphorus and the second sub-dopant is aluminum. A first concentration ratio calculated by dividing the concentration of the first sub-dopant in the silicon melt by the concentration of the main dopant in the silicon melt is not lower than 0.79 and not higher than 0.81. A second concentration ratio calculated by dividing the concentration of the second sub-dopant in the silicon melt by the concentration of the main dopant in the silicon melt is not lower than 24.2 and not higher than 27.0.

In another embodiment for manufacturing a p-type silicon single crystal above, preferably, the first sub-dopant is phosphorus and the second sub-dopant is aluminum. A first concentration ratio calculated by dividing the concentration of the first sub-dopant in the silicon melt by the concentration of the main dopant in the silicon melt is not lower than 0.89 and not higher than 0.91. A second concentration ratio calculated by dividing the concentration of the second sub-dopant in the silicon melt by the concentration of the main dopant in the silicon melt is not lower than 30.8 and not higher than 33.8.

In another embodiment for manufacturing a p-type silicon single crystal above, preferably, the first sub-dopant is phosphorus and the second sub-dopant is gallium. A first concentration ratio calculated by dividing the concentration of the first sub-dopant in the silicon melt by the concentration of the main dopant in the silicon melt is not lower than 0.79 and not higher than 0.81, and a second concentration ratio calculated by dividing the concentration of the second sub-dopant in the silicon melt by the concentration of the main dopant in the silicon melt is not lower than 6.2 and not higher than 6.9.

In another embodiment for manufacturing a p-type silicon single crystal above, preferably, the first sub-dopant is phosphorus and the second sub-dopant is gallium. A first concentration ratio calculated by dividing the concentration of the first sub-dopant in the silicon melt by the concentration of the main dopant in the silicon melt is not lower than 0.89 and not higher than 0.91. A second concentration ratio calculated by dividing the concentration of the second sub-dopant in the silicon melt by the concentration of the main dopant in the silicon melt is not lower than 7.8 and not higher than 8.5.

A p-type silicon single crystal according to the present invention has boron as a main dopant, a first sub-dopant, and a second sub-dopant. The first sub-dopant is an n-type impurity and smaller in segregation coefficient than boron. The second sub-dopant is a p-type impurity and smaller in segregation coefficient than the first sub-dopant. The resistivity is not lower than 6 $\Omega$cm. By thus using a plurality of sub-dopants, a p-type silicon single crystal high in resistivity with reduced variation in resistivity can be obtained.

In the p-type silicon single crystal above, preferably, the first sub-dopant is phosphorus and the second sub-dopant is aluminum. A first concentration ratio calculated by dividing the concentration of the first sub-dopant in the silicon melt by the concentration of the main dopant in the silicon melt is not lower than 0.5 and not higher than 1.2. A second concentration ratio calculated by dividing the concentration of the second sub-dopant in the silicon melt by the concentration of the main dopant in the silicon melt is not lower than 4.9 and not higher than 52.4. Here, the concentration in the silicon melt refers to concentration in the initial silicon melt before growth of the silicon single crystal.

In the p-type silicon single crystal above, preferably, the first sub-dopant is phosphorus and the second sub-dopant is gallium. A first concentration ratio calculated by dividing the concentration of the first sub-dopant in the silicon melt by the concentration of the main dopant in the silicon melt is not lower than 0.5 and not higher than 1.2. A second concentration ratio calculated by dividing the concentration of the second sub-dopant in the silicon melt by the concentration of the main dopant in the silicon melt is not lower than 1.2 and not higher than 13.4.

In the p-type silicon single crystal above, preferably, the first sub-dopant is phosphorus and the second sub-dopant is indium. A first concentration ratio calculated by dividing the concentration of the first sub-dopant in the silicon melt by the concentration of the main dopant in the silicon melt is not lower than 0.5 and not higher than 1.2. A second concentration ratio calculated by dividing the concentration of the second sub-dopant in the silicon melt by the concentration of the main dopant in the silicon melt is not lower than 25.1 and not higher than 261.2.

In the p-type silicon single crystal above, preferably, the first sub-dopant is arsenic and the second sub-dopant is aluminum. A first concentration ratio calculated by dividing the concentration of the first sub-dopant in the silicon melt by the concentration of the main dopant in the silicon melt is not lower than 0.6 and not higher than 1.5. A second concentration ratio calculated by dividing the concentration of the second sub-dopant in the silicon melt by the concentration of the main dopant in the silicon melt is not lower than 11.7 and not higher than 72.2.

In the p-type silicon single crystal above, preferably, the first sub-dopant is arsenic and the second sub-dopant is gallium. A first concentration ratio calculated by dividing the concentration of the first sub-dopant in the silicon melt by the concentration of the main dopant in the silicon melt is not lower than 0.6 and not higher than 1.5. A second concentration ratio calculated by dividing the concentration of the second sub-dopant in the silicon melt by the concentration of the main dopant in the silicon melt is not lower than 3.1 and not higher than 18.3.

In the p-type silicon single crystal above, preferably, the first sub-dopant is arsenic and the second sub-dopant is indium. A first concentration ratio calculated by dividing the concentration of the first sub-dopant in the silicon melt by the concentration of the main dopant in the silicon melt is not lower than 0.6 and not higher than 1.4. A second concentration ratio calculated by dividing the concentration of the second sub-dopant in the silicon melt by the concentration of the main dopant in the silicon melt is not lower than 57.9 and not higher than 324.0.

In the p-type silicon single crystal above, preferably, the first sub-dopant is phosphorus and the second sub-dopant is aluminum. A first concentration ratio calculated by dividing the concentration of the first sub-dopant in the silicon melt by the concentration of the main dopant in the silicon melt is not lower than 0.79 and not higher than 0.81. A second concentration ratio calculated by dividing the concentration of the second sub-dopant in the silicon melt by the concentration of the main dopant in the silicon melt is not lower than 24.2 and not higher than 27.0.

In the p-type silicon single crystal above, preferably, the first sub-dopant is phosphorus and the second sub-dopant is aluminum. A first concentration ratio calculated by dividing the concentration of the first sub-dopant in the silicon melt by the concentration of the main dopant in the silicon melt is not lower than 0.89 and not higher than 0.91. A second concentration ratio calculated by dividing the concentration of the second sub-dopant in the silicon melt by the concentration of the main dopant in the silicon melt is not lower than 30.8 and not higher than 33.8.

In the p-type silicon single crystal above, preferably, the first sub-dopant is phosphorus and the second sub-dopant is gallium. A first concentration ratio calculated by dividing the concentration of the first sub-dopant in the silicon melt by the concentration of the main dopant in the silicon melt is not lower than 0.79 and not higher than 0.81. A second concentration ratio calculated by dividing the concentration of the second sub-dopant in the silicon melt by the concentration of the main dopant in the silicon melt is not lower than 6.2 and not higher than 6.9.

In the p-type silicon single crystal above, preferably, the first sub-dopant is phosphorus and the second sub-dopant is gallium. A first concentration ratio calculated by dividing the concentration of the first sub-dopant in the silicon melt by the concentration of the main dopant in the silicon melt is not lower than 0.89 and not higher than 0.91. A second concentration ratio calculated by dividing the concentration of the second sub-dopant in the silicon melt by the concentration of the main dopant in the silicon melt is not lower than 7.8 and not higher than 8.5.

An embodiment of the present invention will be described hereinafter with reference to the drawings. It is noted that the same or corresponding elements in the drawings below have the same reference numerals allotted and description thereof will not be repeated.

Initially, a manufacturing apparatus for manufacturing a p-type silicon single crystal in the present embodiment will be described with reference to FIG. 1. As shown in FIG. 1, a silicon single crystal manufacturing apparatus 10 has a chamber 2, a heater 6, a crucible 8, a crucible support shaft 13, and a pull-up wire 14. A heat insulator 3 is provided on an inner wall of chamber 2. A gas supply port 4 for introducing an inert gas such as argon (Ar) is provided in an upper portion of chamber 2, and an exhaust port 5 for exhausting a gas in chamber 2 is provided in a bottom portion of chamber 2. Crucible 8 is filled with a doped silicon melt 7. Heater 6 is provided around crucible 8, and silicon melt 7 can be provided by melting a silicon source material. Crucible support shaft 13 extends from a lower end portion of crucible 8 to the bottom portion of the chamber and it is rotatably supported by a crucible support shaft drive device 12. Pull-up wire 14 serves to pull up a silicon single crystal 1 and it is vertically movable by a pull-up wire drive device 15.

Figure 2:
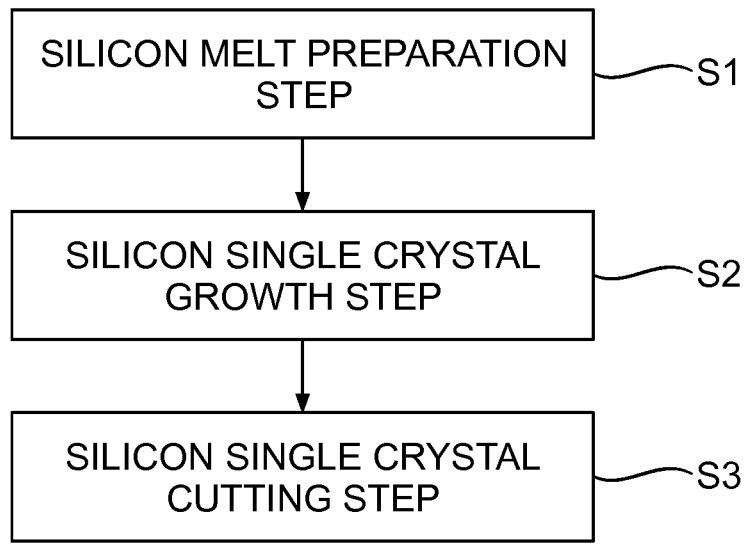
FIG. 2 is a flowchart showing a method of manufacturing a p-type silicon single crystal.

A method of manufacturing a p-type silicon single crystal in the present embodiment will now be described with reference to FIGS. 1 and 2. As shown in FIG. 2, the p-type silicon single crystal according to the present embodiment serves to manufacture a silicon single crystal by the Czochralski method, and essentially has a silicon melt preparation step S1, a silicon single crystal growth step S2, and a silicon single crystal cutting step S3.

In silicon melt preparation step S1, crucible 8 is filled with a silicon source material and heated by heater 6, so that the silicon source material becomes molten. Three types of dopants, a main dopant, a first sub-dopant, and a second sub-dopant, are added to dope the silicon melt. The main dopant is boron representing a p-type impurity. The first sub-dopant is an impurity having an n conductivity type and being smaller in segregation coefficient with respect to the silicon single crystal than boron (B) which is the main dopant. The first sub-dopant is a group V element such as phosphorus (P) or arsenic (As). The second sub-dopant is an impurity having a p conductivity type and being smaller in segregation coefficient with respect to the silicon single crystal than the first sub-dopant. The second sub-dopant is a group III element such as aluminum (Al), gallium (Ga), or indium (In).

In one embodiment, semiconductor-grade silicon is employed as the silicon source material. Semiconductor-grade silicon has a lower impurity concentration and is higher in purity than metallurgical-grade silicon. Semiconductor-grade silicon has silicon purity, for example, of 99.999999999% (11N).

The main dopant, the first sub-dopant, and the second sub-dopant to be added to the silicon source material may be added to the silicon melt all at once or separately. For example, initially, the main dopant may be added to silicon melt 7, followed by the first sub-dopant and then the second sub-dopant.

In silicon single crystal growth step S2, initially, a seed crystal 17 attached to a seed chuck 16 is brought down to a surface of silicon melt 7 and immersed therein. Thereafter, pull-up wire 14 is wound up by pull-up wire drive device 15 to thereby pull up silicon single crystal 1. After silicon single crystal 1 undergoes growth of a conical portion (an expanded portion) and grows to a target diameter, a straight part of ingot 11 is grown to a prescribed length.

In silicon single crystal cutting step S3, initially, the straight part of ingot 11 is grown to the prescribed length, and thereafter wind-up of pull-up wire 14 is stopped. Thereafter, by lowering crucible 8, silicon single crystal 1 is separated from the silicon melt 7. By slicing the silicon single crystal 1 along a plane perpendicular to the direction of the axis of growth of the silicon single crystal 1, a silicon wafer is obtained.

Figure 3:
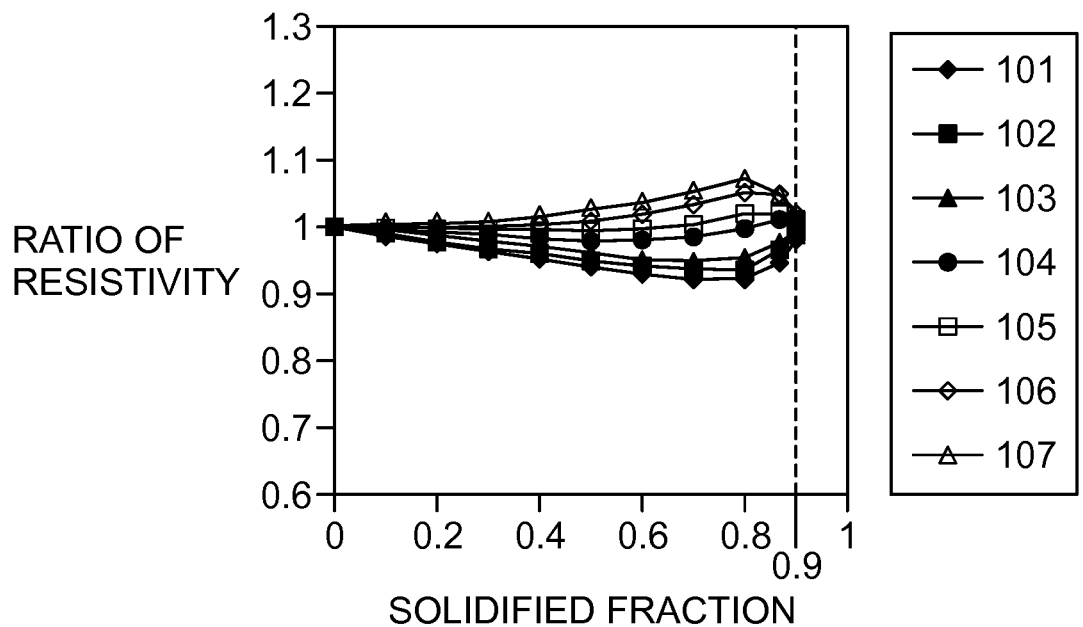
FIG. 3 is a diagram showing the relationship between resistivity and a solidified fraction of a p-type silicon single crystal.

A result of simulation of the relationship between resistivity and a solidified fraction of a silicon single crystal will now be described with reference to FIG. 3. The abscissa in FIG. 3 represents the solidified fraction. The solidified fraction refers to a ratio of the mass of crystallized silicon with respect to the total mass of source material silicon contained in the silicon melt. The ordinate in FIG. 3 represents the ratio of resistivity in a direction of the axis of growth D of silicon single crystal 1. Here, the resistivity is the resistivity at the center (that is, along the axis of growth) of the silicon single crystal. In addition, a ratio of resistivity refers to a value calculated by standardizing resistivity at a certain solidified fraction with resistivity at a solidified fraction of 0.

In FIG. 3, samples 101 to 107 each represent a p-type silicon single crystal produced by the Czochralski method from the silicon melt, to which boron, phosphorus, and aluminum have been added as the main dopant, the first sub-dopant, and the second sub-dopant, respectively.

Boron concentrations in the silicon melts for samples 101 to 107 are $3.2 \times 10^{15}$ atoms/cm³ (101), $1.1 \times 10^{15}$ atoms/cm³ (102), $1.2 \times 10^{15}$ atoms/cm³ (103), $2.6 \times 10^{14}$ atoms/cm³ (104), $2.1 \times 10^{14}$ atoms/cm³ (105), $1.9 \times 10^{14}$ atoms/cm³ (106), and $2.0 \times 10^{14}$ atoms/cm³ (107), respectively.

First concentration ratios calculated by dividing the phosphorus concentrations in the silicon melts for samples 101 to 107 by the boron concentrations are 0.50 (101), 0.60 (102), 0.70 (103), 0.90 (104), 1.00 (105), 1.10 (106), and 1.20 (107), respectively.

Second concentration ratios calculated by dividing the aluminum concentrations in the silicon melts for samples 101 to 107 by the boron concentrations are 5.60 (101), 11.70 (102), 18.50 (103), 31.76 (104), 38.65 (105), 45.06 (106), and 52.40 (107), respectively.

As can be seen in FIG. 3, in a range of the solidified fraction from 0 to 0.9, the variation in resistivity in the direction of the axis of growth of silicon single crystal samples 101 to 107 is very low, that is, approximately from 3 to 8% or lower. It is noted that the variation in resistivity is a value defined by Equation 1. Here, the maximum value of resistivity is a maximum value of resistivity of the silicon single crystal in the direction of the axis of growth, and the minimum value of resistivity is a minimum value of resistivity of the silicon single crystal in the direction of the axis of growth.

$$\text{Variation in Resistivity} = \frac{(\text{Maximum Value of Resistivity} - \text{Minimum Value of Resistivity})}{\text{Maximum Value of Resistivity}} \times 100 \quad \text{Equation 1}$$

A substrate used for a power device such as an IGBT is required to be high in resistivity and low in variation in resistivity. Specifically, resistivity of the p-type silicon single crystal is desirably not lower than 6 Ωcm, preferably not lower than 50 Ωcm, and most preferably not lower than 100 Ωcm. In addition, the variation in resistivity of the p-type silicon single crystal is desirably not higher than 20%, preferably not higher than 15%, more preferably not higher than 8%, and most preferably not higher than 5%.

A mechanism with which the variation in the resistivity of the silicon single crystal can be lowered will now be described.

In the case where only boron (the main dopant) is added to the silicon melt, the boron concentration in the silicon single crystal becomes higher as the silicon single crystal grows (that is, as the solidified fraction becomes greater). Therefore, the resistivity decreases in the lower portion of the silicon single crystal. The reason is as follows. The boron concentration in the silicon melt increases as the silicon single crystal grows, because boron has a segregation coefficient with respect to the silicon single crystal of around 0.78, which is lower than 1. Consequently, the ratio of boron taken into the silicon single crystal steadily increases and the resistivity decreases.

Similarly in the case where phosphorus is added to the silicon melt as well, the phosphorus concentration in the silicon single crystal becomes higher as the silicon single crystal grows. Therefore, the resistivity decreases in the lower portion of the silicon single crystal. Phosphorus has a segregation coefficient with respect to the silicon single crystal of around 0.38, which is lower than that of boron. Therefore, the rate of concentration of phosphorus in the silicon melt during growth of the silicon single crystal is greater than the rate of concentration of boron. Thus, the rate of decrease in resistivity during growth of the silicon single crystal is also greater in the case where phosphorus is added than in the case where boron is added.

In the case where boron (the main dopant) and phosphorus (the first sub-dopant) are added to the silicon melt, carriers that are produced and opposite in conductivity type cancel each other, because boron represents a p-type impurity and phosphorus represents an n-type impurity. Therefore, by adding phosphorus together with boron to the silicon single crystal, the density of p-type carriers can be lowered and resistivity can be increased. In addition, the rate of increase in impurity concentration with growth of the silicon single crystal is greater in the case where phosphorus is added than in the case where boron is added. Therefore, the rate of decrease in resistivity with growth of the silicon single crystal can be lowered by canceling the increase in p-type carrier density owing to the increase in boron concentration with growth of the silicon single crystal, with an increase in n-type carrier density owing to an increase in phosphorus concentration.

When the solidified fraction is small, the rate of decrease in resistivity with growth of the silicon single crystal can be lowered. When the solidified fraction becomes greater, however, the increase in n-type carrier density owing to the increase in phosphorus concentration prevails and resistivity becomes higher as the silicon single crystal grows.

In the case where aluminum (the second sub-dopant), lower in segregation coefficient than phosphorus (the first sub-dopant) is added to the silicon melt, substantially no p-type carriers produced by aluminum are taken into the silicon single crystal when the solidified fraction is small. When the solidified fraction becomes greater, however, aluminum is gradually taken into the silicon single crystal and p-type carriers increase. Consequently, resistivity gradually becomes lower. Therefore, addition of aluminum can suppress an increase in resistivity of the silicon single crystal when the solidified fraction is large. Consequently, the variation in resistivity in the direction of the axis of growth of the silicon single crystal can be lessened.

Thus, the first sub-dopant which is an n-type impurity and smaller in segregation coefficient than the main dopant can suppress the change in resistivity of the silicon single crystal when the solidified fraction is small, and the second sub-dopant which is a p-type impurity and smaller in segregation coefficient than the first sub-dopant can suppress change in resistivity of the silicon single crystal when the solidified fraction is great.

TABLE 1

| B Concentration (atoms/cm³) | Dopant Ratio (Initial Si Melt) | | Maximum Value of Resistivity (ohm cm) | Minimum Value of Resistivity (ohm cm) | Variation in Resistivity in Direction of Axis (%) |
|---|---|---|---|---|---|
| Initial Si Melt | P/B | Al/B | \multicolumn{3}{c}{Range of Solidified Fraction: 0-0.9} |
| $3.03 \times 10^{15}$ | 0.40 | 1.1 | 7.0 | 6.2 | 11.0 |
| $3.18 \times 10^{15}$ | 0.50 | 4.5 | 7.1 | 6.5 | 8.5 |

TABLE 1-continued

| B Concentration (atoms/cm³) Initial Si Melt | Dopant Ratio (Initial Si Melt) | | Maximum Value of Resistivity (ohm cm) | Minimum Value of Resistivity (ohm cm) | Variation in Resistivity in Direction of Axis (%) |
|---|---|---|---|---|---|
| | P/B | Al/B | Range of Solidified Fraction: 0-0.9 | | |
| $3.18 \times 10^{15}$ | 0.50 | 4.9 | 7.0 | 6.5 | 7.7 |
| $3.17 \times 10^{15}$ | 0.50 | 5.6 | 7.0 | 6.5 | 7.8 |
| $3.17 \times 10^{15}$ | 0.50 | 6.0 | 7.0 | 6.4 | 8.0 |
| $2.31 \times 10^{15}$ | 0.60 | 10.5 | 10.4 | 9.5 | 9.0 |
| $2.30 \times 10^{15}$ | 0.60 | 11.0 | 10.2 | 9.4 | 7.9 |
| $1.14 \times 10^{15}$ | 0.60 | 11.7 | 20.0 | 18.8 | 6.4 |
| $1.13 \times 10^{15}$ | 0.60 | 13.0 | 20.0 | 18.6 | 7.1 |
| $1.13 \times 10^{15}$ | 0.60 | 13.8 | 20.0 | 18.4 | 8.0 |
| $1.20 \times 10^{15}$ | 0.70 | 16.0 | 21.7 | 19.3 | 11.2 |
| $1.19 \times 10^{15}$ | 0.70 | 17.3 | 20.8 | 19.2 | 7.7 |
| $1.19 \times 10^{15}$ | 0.70 | 18.5 | 20.0 | 19.0 | 4.8 |
| $7.80 \times 10^{14}$ | 0.70 | 21.2 | 30.0 | 27.7 | 7.8 |
| $4.64 \times 10^{14}$ | 0.70 | 23.0 | 50.0 | 43.8 | 12.4 |
| $4.98 \times 10^{14}$ | 0.80 | 22.0 | 56.2 | 49.0 | 12.7 |
| $4.95 \times 10^{14}$ | 0.80 | 23.6 | 52.9 | 48.8 | 7.9 |
| $4.92 \times 10^{14}$ | 0.80 | 25.2 | 50.1 | 48.3 | 3.5 |
| $4.89 \times 10^{14}$ | 0.80 | 26.8 | 50.0 | 47.6 | 4.9 |
| $4.87 \times 10^{14}$ | 0.80 | 27.8 | 50.0 | 46.1 | 7.8 |
| $2.42 \times 10^{14}$ | 0.80 | 29.0 | 100.0 | 89.0 | 11.0 |
| $1.19 \times 10^{15}$ | 0.79 | 24.2 | 21.0 | 20.0 | 4.5 |
| $1.19 \times 10^{15}$ | 0.81 | 24.2 | 22.4 | 20.6 | 8.0 |
| $7.80 \times 10^{14}$ | 0.79 | 27.0 | 31.2 | 28.9 | 7.4 |
| $4.64 \times 10^{14}$ | 0.81 | 27.0 | 53.0 | 51.0 | 3.9 |
| $2.60 \times 10^{14}$ | 0.90 | 29.0 | 111.9 | 99.0 | 11.5 |
| $2.58 \times 10^{14}$ | 0.90 | 30.1 | 107.2 | 98.8 | 7.8 |
| $2.57 \times 10^{14}$ | 0.90 | 31.8 | 101.2 | 98.2 | 3.0 |
| $2.55 \times 10^{14}$ | 0.90 | 33.5 | 100.0 | 95.0 | 5.0 |
| $2.54 \times 10^{14}$ | 0.90 | 34.4 | 100.0 | 92.3 | 7.7 |
| $1.94 \times 10^{14}$ | 0.90 | 36.0 | 130.0 | 114.3 | 12.1 |
| $1.94 \times 10^{14}$ | 0.89 | 30.8 | 134.1 | 129.3 | 3.6 |
| $1.94 \times 10^{14}$ | 0.91 | 30.8 | 143.1 | 132.1 | 7.7 |
| $1.94 \times 10^{14}$ | 0.89 | 33.8 | 130.2 | 119.9 | 7.9 |
| $1.94 \times 10^{14}$ | 0.91 | 33.8 | 132.1 | 127.1 | 3.8 |
| $2.11 \times 10^{14}$ | 1.00 | 34.0 | 158.0 | 129.9 | 17.8 |
| $2.08 \times 10^{14}$ | 1.00 | 36.7 | 140.8 | 129.5 | 8.0 |
| $2.07 \times 10^{14}$ | 1.00 | 38.7 | 133.0 | 129.0 | 3.0 |
| $2.06 \times 10^{14}$ | 1.00 | 40.1 | 130.0 | 123.9 | 4.7 |
| $2.05 \times 10^{14}$ | 1.00 | 41.0 | 130.0 | 120.2 | 7.6 |
| $1.76 \times 10^{14}$ | 1.00 | 43.0 | 150.0 | 130.1 | 13.3 |
| $1.90 \times 10^{14}$ | 1.10 | 43.0 | 168.3 | 150.0 | 10.9 |
| $1.88 \times 10^{14}$ | 1.10 | 45.1 | 158.3 | 149.9 | 5.3 |
| $1.87 \times 10^{14}$ | 1.10 | 47.2 | 152.5 | 141.0 | 7.5 |
| $1.87 \times 10^{14}$ | 1.10 | 47.5 | 151.6 | 139.3 | 8.1 |
| $1.99 \times 10^{14}$ | 1.20 | 51.9 | 163.0 | 150.0 | 8.0 |
| $1.98 \times 10^{14}$ | 1.20 | 52.4 | 161.3 | 149.0 | 7.6 |
| $2.09 \times 10^{14}$ | 1.30 | 59.1 | 167.0 | 149.3 | 10.6 |

Table 1 shows results of simulation of the maximum and minimum values of resistivity and the variation in resistivity in the direction of the growth axis of the silicon single crystals when a value calculated by dividing the concentration of the first sub-dopant in the silicon melt by the concentration of the main dopant in the silicon melt (the first concentration ratio) is varied in a range not lower than approximately 0.4 and not higher than approximately 1.3 and a value calculated by dividing the concentration of the second sub-dopant in the silicon melt by the concentration of the main dopant in the silicon melt (the second concentration ratio) is varied in a range not lower than approximately 1.1 and not higher than approximately 59.1 in the case where boron (B), phosphorus (P), and aluminum (Al) are employed as the main dopant, the first sub-dopant, and the second sub-dopant to be added to the silicon melt, respectively. The boron concentration in this case is not lower than approximately $1.87 \times 10^{14}$ atoms/cm³ and not higher than approximately $3.18 \times 10^{15}$ atoms/cm³.

In this case, a p-type silicon single crystal can be obtained in which the maximum value of resistivity is not lower than approximately 7.0 Ωcm and not higher than approximately 168.3 Ωcm, the minimum value of resistivity is not lower than approximately 6.2 Ωcm and not higher than approximately 150.0 Ωcm, and the variation in resistivity in the direction of the axis of growth is not higher than approximately 17.8%.

More preferably, a value calculated by dividing the concentration of the first sub-dopant in the silicon melt by the concentration of the main dopant in the silicon melt (the first concentration ratio) is in a range not lower than approximately 0.5 and not higher than approximately 1.2 and a value calculated by dividing the concentration of the second sub-dopant in the silicon melt by the concentration of the main dopant in the silicon melt (the second concentration ratio) is in a range not lower than approximately 4.9 and not higher than approximately 52.4. The boron concentration in this case is not lower than approximately $1.87 \times 10^{14}$ atoms/cm³ and not higher than approximately $3.18 \times 10^{15}$ atoms/cm³.

In this case, a p-type silicon single crystal can be obtained in which the maximum value of resistivity is not lower than approximately 7.0 Ωcm and not higher than approximately 168.3 Ωcm, the minimum value of resistivity is not lower than approximately 6.5 Ωcm and not higher than approximately 150.0 Ωcm, and the variation in resistivity in the direction of axis of growth is not higher than approximately 17.8%.

More preferably, a value calculated by dividing the concentration of the first sub-dopant in the silicon melt by the concentration of the main dopant in the silicon melt (the first concentration ratio) is in a range not lower than approximately 0.79 and not higher than approximately 0.81 and a value calculated by dividing the concentration of the second sub-dopant in the silicon melt by the concentration of the main dopant in the silicon melt (the second concentration ratio) is in a range not lower than approximately 24.2 and not higher than approximately 27.0. The boron concentration in this case is not lower than approximately $4.64 \times 10^{14}$ atoms/cm³ and not higher than approximately $1.19 \times 10^{15}$ atoms/cm³.

In this case, a p-type silicon single crystal can be obtained in which the maximum value of resistivity is not lower than approximately 21.0 Ωcm and not higher than approximately 53.0 Ωcm, minimum value of resistivity is not lower than approximately 20.0 Ωcm and not higher than approximately 51.0 Ωcm, and the variation in resistivity in the direction of the axis of growth is not higher than approximately 8.0%.

More preferably, a value calculated by dividing the concentration of the first sub-dopant in the silicon melt by the concentration of the main dopant in the silicon melt (the first concentration ratio) is in a range not lower than approximately 0.89 and not higher than approximately 0.91 and a value calculated by dividing the concentration of the second sub-dopant in the silicon melt by the concentration of the main dopant in the silicon melt (the second concentration ratio) is in a range not lower than approximately 30.8 and not higher than approximately 33.8. The boron concentration in this case is not lower than approximately $1.94 \times 10^{14}$ atoms/cm³ and not higher than approximately $2.57 \times 10^{14}$ atoms/cm³.

In this case, a p-type silicon single crystal can be obtained in which maximum value of resistivity is not lower than approximately 100.0 Ωcm and not higher than approximately 143.1 Ωcm, minimum value of resistivity is not lower than approximately 95.0 Ωcm and not higher than approximately 132.1 Ωcm, and the variation in resistivity in the direction of the axis of growth is not higher than approximately 7.9%.

TABLE 2

| B Concentration (atoms/cm³) | Dopant Ratio (Initial Si Melt) | | Maximum Value of Resistivity (ohm cm) | Minimum Value of Resistivity (ohm cm) | Variation in Resistivity in Direction of Axis (%) |
|---|---|---|---|---|---|
| Initial Si Melt | P/B | Ga/B | Range of Solidified Fraction: 0-0.9 | | |
| $3.04 \times 10^{15}$ | 0.40 | 0.1 | 7.0 | 6.3 | 10.3 |
| $3.18 \times 10^{15}$ | 0.50 | 1.2 | 7.1 | 6.5 | 8.0 |
| $3.17 \times 10^{15}$ | 0.50 | 1.4 | 7.0 | 6.5 | 7.8 |
| $3.17 \times 10^{15}$ | 0.50 | 1.5 | 7.0 | 6.4 | 8.0 |
| $2.31 \times 10^{15}$ | 0.60 | 2.7 | 10.4 | 9.5 | 8.7 |
| $2.30 \times 10^{15}$ | 0.60 | 2.8 | 10.2 | 9.4 | 7.8 |
| $2.28 \times 10^{15}$ | 0.60 | 3.4 | 10.0 | 9.2 | 7.5 |
| $2.28 \times 10^{15}$ | 0.60 | 3.6 | 10.0 | 9.2 | 8.4 |
| $1.20 \times 10^{15}$ | 0.70 | 4.0 | 21.9 | 19.3 | 11.9 |
| $1.19 \times 10^{15}$ | 0.70 | 4.4 | 20.8 | 19.2 | 7.7 |
| $1.19 \times 10^{15}$ | 0.70 | 4.7 | 20.0 | 19.0 | 4.9 |
| $1.17 \times 10^{15}$ | 0.70 | 5.3 | 20.0 | 18.6 | 7.1 |
| $1.17 \times 10^{15}$ | 0.70 | 5.8 | 20.0 | 17.6 | 11.9 |
| $8.30 \times 10^{14}$ | 0.80 | 5.7 | 33.1 | 29.4 | 11.3 |
| $8.26 \times 10^{14}$ | 0.80 | 6.0 | 31.7 | 29.2 | 7.8 |
| $8.23 \times 10^{14}$ | 0.80 | 6.3 | 30.4 | 29.0 | 4.6 |
| $8.20 \times 10^{14}$ | 0.80 | 6.5 | 30.0 | 28.9 | 3.6 |
| $8.17 \times 10^{14}$ | 0.80 | 6.8 | 30.0 | 28.6 | 4.8 |
| $8.14 \times 10^{14}$ | 0.80 | 7.0 | 30.0 | 27.9 | 7.1 |
| $8.08 \times 10^{14}$ | 0.80 | 7.5 | 30.0 | 26.3 | 12.3 |
| $8.08 \times 10^{14}$ | 0.79 | 6.2 | 30.5 | 29.3 | 3.9 |
| $8.08 \times 10^{14}$ | 0.81 | 6.2 | 32.4 | 30.0 | 7.4 |
| $8.08 \times 10^{14}$ | 0.79 | 6.9 | 30.1 | 27.7 | 7.8 |
| $8.08 \times 10^{14}$ | 0.81 | 6.9 | 30.5 | 29.2 | 4.2 |
| $5.23 \times 10^{14}$ | 0.90 | 7.0 | 59.3 | 49.7 | 16.3 |
| $5.17 \times 10^{14}$ | 0.90 | 7.7 | 53.1 | 49.3 | 7.1 |
| $5.15 \times 10^{14}$ | 0.90 | 7.9 | 51.6 | 49.2 | 4.7 |
| $5.12 \times 10^{14}$ | 0.90 | 8.3 | 50.0 | 48.8 | 2.4 |
| $5.11 \times 10^{14}$ | 0.90 | 8.5 | 50.0 | 47.6 | 4.9 |
| $5.09 \times 10^{14}$ | 0.90 | 8.7 | 50.0 | 46.4 | 7.3 |
| $5.07 \times 10^{14}$ | 0.90 | 9.0 | 50.0 | 44.7 | 10.6 |
| $5.07 \times 10^{14}$ | 0.89 | 7.8 | 51.6 | 49.6 | 3.9 |
| $5.07 \times 10^{14}$ | 0.91 | 7.8 | 55.1 | 50.7 | 8.0 |
| $5.07 \times 10^{14}$ | 0.89 | 8.5 | 50.0 | 46.6 | 6.9 |
| $5.07 \times 10^{14}$ | 0.91 | 8.5 | 50.7 | 49.4 | 2.7 |
| $2.72 \times 10^{14}$ | 1.00 | 9.0 | 113.9 | 99.7 | 12.4 |
| $2.70 \times 10^{14}$ | 1.00 | 9.4 | 107.1 | 99.5 | 7.1 |
| $2.69 \times 10^{14}$ | 1.00 | 9.7 | 103.5 | 99.3 | 4.0 |
| $2.67 \times 10^{14}$ | 1.00 | 10.0 | 100.7 | 97.7 | 3.0 |
| $2.67 \times 10^{14}$ | 1.00 | 10.2 | 100.0 | 95.1 | 4.9 |
| $2.66 \times 10^{14}$ | 1.00 | 10.4 | 100.0 | 92.6 | 7.4 |
| $2.63 \times 10^{14}$ | 1.00 | 11.0 | 100.0 | 85.9 | 14.1 |
| $2.20 \times 10^{14}$ | 1.10 | 10.5 | 155.1 | 130.0 | 16.2 |
| $2.18 \times 10^{14}$ | 1.10 | 11.2 | 140.4 | 129.9 | 7.4 |
| $2.16 \times 10^{14}$ | 1.10 | 11.7 | 134.3 | 127.1 | 5.4 |
| $2.15 \times 10^{14}$ | 1.10 | 12.0 | 131.6 | 121.8 | 7.4 |
| $2.13 \times 10^{14}$ | 1.10 | 12.5 | 130.0 | 113.9 | 12.4 |
| $2.00 \times 10^{14}$ | 1.20 | 12.5 | 175.2 | 150.0 | 14.4 |
| $1.98 \times 10^{14}$ | 1.20 | 13.2 | 162.0 | 150.0 | 7.4 |
| $1.97 \times 10^{14}$ | 1.20 | 13.4 | 159.5 | 146.8 | 8.0 |
| $1.95 \times 10^{14}$ | 1.20 | 14.0 | 153.3 | 134.4 | 12.3 |
| $2.08 \times 10^{14}$ | 1.30 | 15.1 | 164.9 | 146.9 | 10.9 |

Table 2 shows results of simulation of a maximum value and a minimum value of resistivity and the variation in resistivity in a direction of the axis-of-growth of the silicon single crystals when a value calculated by dividing the concentration of the first sub-dopant in the silicon melt by the concentration of the main dopant in the silicon melt (the first concentration ratio) is varied in a range not lower than approximately 0.4 and not higher than approximately 1.3 and a value calculated by dividing the concentration of the second sub-dopant in the silicon melt by the concentration of the main dopant in the silicon melt (the second concentration ratio) is varied in a range not lower than approximately 0.1 and not higher than approximately 15.1 in a case where boron (B), phosphorus (P), and gallium (Ga) are employed as the main dopant, the first sub-dopant, and the second sub-dopant to be added to the silicon melt, respectively. The boron concentration in this case is not lower than approximately $1.95 \times 10^{14}$ atoms/cm³ and not higher than approximately $3.18 \times 10^{15}$ atoms/cm³.

In this case, a p-type silicon single crystal can be obtained in which the maximum value of resistivity is not lower than approximately 7.0 Ωcm and not higher than approximately 175.2 Ωcm, minimum value of resistivity is not lower than approximately 6.3 Ωcm and not higher than approximately 150.0 Ωcm, and the variation in resistivity in the direction of the axis of growth is not higher than approximately 16.3%.

More preferably, a value calculated by dividing the concentration of the first sub-dopant in the silicon melt by the concentration of the main dopant in the silicon melt (the first concentration ratio) is in a range not lower than approximately 0.5 and not higher than approximately 1.2 and a value calculated by dividing the concentration of the second sub-dopant in the silicon melt by the concentration of the main dopant in the silicon melt (the second concentration ratio) is in a range not lower than approximately 1.2 and not higher than approximately 13.4. The boron concentration in this case is not lower than approximately $1.97 \times 10^{14}$ atoms/cm³ and not higher than approximately $3.18 \times 10^{15}$ atoms/cm³.

In this case, a p-type silicon single crystal can be obtained in which maximum value of resistivity is not lower than approximately 7.0 Ωcm and not higher than approximately 175.2 Ωcm, the minimum value of resistivity is not lower than approximately 6.5 Ωcm and not higher than approximately 150.0 Ωcm, and the variation in resistivity in the direction of the axis of growth is not higher than approximately 16.3%.

More preferably, a value calculated by dividing the concentration of the first sub-dopant in the silicon melt by the concentration of the main dopant in the silicon melt (the first concentration ratio) is in a range not lower than approximately 0.79 and not higher than approximately 0.81 and a value calculated by dividing the concentration of the second sub-dopant in the silicon melt by the concentration of the main dopant in the silicon melt (the second concentration ratio) is in a range not lower than approximately 6.2 and not higher than approximately 6.9. The boron concentration in this case is not lower than approximately $8.08 \times 10^{14}$ atoms/cm³ and not higher than approximately $8.23 \times 10^{14}$ atoms/cm³.

In this case, a p-type silicon single crystal can be obtained in which the maximum value of resistivity is not lower than approximately 30.0 Ωcm and not higher than approximately 32.4 Ωcm, the minimum value of resistivity is not lower than approximately 28.6 Ωcm and not higher than approximately 30.0 Ωcm, and the variation in resistivity in the direction of the axis of growth is not higher than approximately 7.8%.

More preferably, a value calculated by dividing the concentration of the first sub-dopant in the silicon melt by the concentration of the main dopant in the silicon melt (the first concentration ratio) is in a range not lower than approximately 0.89 and not higher than approximately 0.91 and a value calculated by dividing the concentration of the second sub-dopant in the silicon melt by the concentration of the main dopant in the silicon melt (the second concentration ratio) is in a range not lower than approximately 7.8 and not higher than approximately 8.5. Boron concentration in this case is not lower than approximately $5.07 \times 10^{14}$ atoms/cm³ and not higher than approximately $5.15 \times 10^{14}$ atoms/cm³.

In this case, a p-type silicon single crystal can be obtained in which the maximum value of resistivity is not lower than approximately 50.0 Ωcm and not higher than approximately 55.1 Ωcm, the minimum value of resistivity is not lower than approximately 47.6 Ωcm and not higher than approximately 50.7 Ωcm, and the variation in resistivity in the direction of the axis of growth is not higher than approximately 8.0%.

TABLE 3

| B Concentration (atoms/cm$^3$) | Dopant Ratio (Initial Si Melt) | | Maximum Value of Resistivity (ohm cm) | Minimum Value of Resistivity (ohm cm) | Variation in Resistivity in Direction of Axis (%) |
|---|---|---|---|---|---|
| Initial Si Melt | P/B | In/B | Range of Solidified Fraction: 0-0.9 | | |
| $3.28 \times 10^{15}$ | 0.50 | 25.1 | 6.8 | 6.3 | 7.5 |
| $3.41 \times 10^{15}$ | 0.60 | 58.7 | 6.8 | 6.4 | 6.2 |
| $3.59 \times 10^{15}$ | 0.70 | 78.0 | 7.5 | 6.6 | 11.9 |
| $4.73 \times 10^{14}$ | 0.70 | 86.0 | 52.1 | 48.0 | 7.8 |
| $4.71 \times 10^{14}$ | 0.70 | 92.3 | 50.0 | 47.6 | 4.9 |
| $4.67 \times 10^{14}$ | 0.70 | 105.0 | 50.0 | 46.2 | 7.6 |
| $2.32 \times 10^{14}$ | 0.70 | 110.0 | 100.0 | 89.8 | 10.2 |
| $2.69 \times 10^{14}$ | 1.00 | 194.2 | 101.7 | 99.1 | 2.5 |
| $2.87 \times 10^{14}$ | 1.10 | 210.0 | 115.4 | 100.0 | 13.3 |
| $2.19 \times 10^{14}$ | 1.10 | 220.0 | 140.5 | 130.0 | 7.5 |
| $2.17 \times 10^{14}$ | 1.10 | 226.8 | 136.1 | 129.7 | 4.7 |
| $2.16 \times 10^{14}$ | 1.10 | 235.0 | 132.2 | 122.1 | 7.7 |
| $2.15 \times 10^{14}$ | 1.10 | 240.0 | 130.4 | 117.9 | 9.6 |
| $1.98 \times 10^{14}$ | 1.20 | 261.2 | 161.3 | 148.8 | 7.8 |
| $2.10 \times 10^{14}$ | 1.30 | 291.3 | 169.4 | 150.0 | 11.5 |

TABLE 4

| B Concentration (atoms/cm$^3$) | Dopant Ratio (Initial Si Melt) | | Maximum Value of Resistivity (ohm cm) | Minimum Value of Resistivity (ohm cm) | Variation in Resistivity in Direction of Axis (%) |
|---|---|---|---|---|---|
| Initial Si Melt | As/B | Al/B | Range of Solidified Fraction: 0-0.9 | | |
| $3.01 \times 10^{15}$ | 0.50 | 5.0 | 7.0 | 6.4 | 8.6 |
| $3.09 \times 10^{15}$ | 0.60 | 11.7 | 7.0 | 6.5 | 7.6 |
| $3.51 \times 10^{15}$ | 1.00 | 34.0 | 8.2 | 6.9 | 15.7 |
| $4.75 \times 10^{14}$ | 1.00 | 37.0 | 52.5 | 48.7 | 7.3 |
| $4.72 \times 10^{14}$ | 1.00 | 38.5 | 50.0 | 48.3 | 3.4 |
| $4.68 \times 10^{14}$ | 1.00 | 41.0 | 50.0 | 46.3 | 7.4 |
| $2.35 \times 10^{14}$ | 1.00 | 43.0 | 98.4 | 86.1 | 12.5 |
| $2.42 \times 10^{14}$ | 1.10 | 45.4 | 100.0 | 97.6 | 2.4 |
| $2.50 \times 10^{14}$ | 1.30 | 54.0 | 126.3 | 105.2 | 16.7 |
| $2.50 \times 10^{14}$ | 1.30 | 57.0 | 111.8 | 103.6 | 7.3 |
| $2.50 \times 10^{14}$ | 1.30 | 58.9 | 105.8 | 102.3 | 3.3 |
| $2.50 \times 10^{14}$ | 1.30 | 61.0 | 102.4 | 94.6 | 7.6 |
| $1.69 \times 10^{14}$ | 1.30 | 64.0 | 150.0 | 126.6 | 15.6 |
| $1.84 \times 10^{14}$ | 1.50 | 72.2 | 160.7 | 149.3 | 7.1 |
| $1.91 \times 10^{14}$ | 1.60 | 78.6 | 165.6 | 150.0 | 9.4 |

Table 3 shows results of simulation of a maximum value and a minimum value of resistivity and variation in resistivity in a direction of axis-of-growth of the silicon single crystals when a value calculated by dividing the concentration of the first sub-dopant in the silicon melt by the concentration of the main dopant in the silicon melt (the first concentration ratio) is varied in a range not lower than approximately 0.5 and not higher than approximately 1.3 and a value calculated by dividing the concentration of the second sub-dopant in the silicon melt by the concentration of the main dopant in the silicon melt (the second concentration ratio) is varied in a range not lower than approximately 25.1 and not higher than approximately 291.3 in a case where boron (B), phosphorus (P), and indium (In) are employed as the main dopant, the first sub-dopant, and the second sub-dopant to be added to the silicon melt, respectively. The boron concentration in this case is not lower than approximately $1.98 \times 10^{14}$ atoms/cm$^3$ and not higher than approximately $3.59 \times 10^{15}$ atoms/cm$^3$.

In this case, a p-type silicon single crystal can be obtained in which the maximum value of resistivity is not lower than approximately 6.8 Ωcm and not higher than approximately 169.4 Ωcm, the minimum value of resistivity is not lower than approximately 6.3 Ωcm and not higher than approximately 150.0 Ωcm, and the variation in resistivity in the direction of the axis of growth is not higher than approximately 13.3%.

More preferably, a value calculated by dividing the concentration of the first sub-dopant in the silicon melt by the concentration of the main dopant in the silicon melt (the first concentration ratio) is in a range not lower than approximately 0.5 and not higher than approximately 1.2 and a value calculated by dividing the concentration of the second sub-dopant in the silicon melt by the concentration of the main dopant in the silicon melt (the second concentration ratio) is in a range not lower than approximately 25.1 and not higher than approximately 261.2. The boron concentration in this case is not lower than approximately $1.98 \times 10^{14}$ atoms/cm$^3$ and not higher than approximately $3.59 \times 10^{15}$ atoms/cm$^3$.

In this case, a p-type silicon single crystal can be obtained in which the maximum value of resistivity is not lower than approximately 6.8 Ωcm and not higher than approximately 161.3 Ωcm, the minimum value of resistivity is not lower than approximately 6.3 Ωcm and not higher than approximately 148.8 Ωcm, and the variation in resistivity in the direction of the axis of growth is not higher than approximately 13.3%.

Table 4 shows results of simulation of a maximum value and a minimum value of resistivity and variation in resistivity in a direction of axis-of-growth of the silicon single crystals when a value calculated by dividing the concentration of the first sub-dopant in the silicon melt by the concentration of the main dopant in the silicon melt (the first concentration ratio) is varied in a range not lower than approximately 0.5 and not higher than approximately 1.6 and a value calculated by dividing the concentration of the second sub-dopant in the silicon melt by the concentration of the main dopant in the silicon melt (the second concentration ratio) is varied in a range not lower than approximately 5.0 and not higher than approximately 78.6 in the case where boron (B), arsenic (As), and aluminum (Al) are employed as the main dopant, the first sub-dopant, and the second sub-dopant to be added to the silicon melt, respectively. The boron concentration in this case is not lower than approximately $1.69 \times 10^{14}$ atoms/cm$^3$ and not higher than approximately $3.51 \times 10^{15}$ atoms/cm$^3$.

In this case, a p-type silicon single crystal can be obtained in which the maximum value of resistivity is not lower than approximately 7.0 Ωcm and not higher than approximately 165.6 Ωcm, the minimum value of resistivity is not lower than approximately 6.4 Ωcm and not higher than approximately 150.0 Ωcm, and the variation in resistivity in the direction of the axis of growth is not higher than approximately 16.7%.

More preferably, a value calculated by dividing the concentration of the first sub-dopant in the silicon melt by the concentration of the main dopant in the silicon melt (the first concentration ratio) is in a range not lower than approximately 0.6 and not higher than approximately 1.5 and a value calculated by dividing the concentration of the second sub-dopant in the silicon melt by the concentration of the main dopant in the silicon melt (the second concentration ratio) is in a range not lower than approximately 11.7 and not higher than approximately 72.2. The boron concentration in this case is not lower than approximately $1.69 \times 10^{14}$ atoms/cm$^3$ and not higher than approximately $3.51 \times 10^{15}$ atoms/cm$^3$.

In this case, a p-type silicon single crystal can be obtained in which the maximum value of resistivity is not lower than approximately 7.0 Ωcm and not higher than approximately 160.7 Ωcm, the minimum value of resistivity is not lower than approximately 6.5 Ωcm and not higher than approximately 149.3 Ωcm, and the variation in resistivity in the direction of the axis of growth is not higher than approximately 16.7%.

TABLE 5

| B Concentration (atoms/cm³) | Dopant Ratio (Initial Si Melt) | | Maximum Value of Resistivity (ohm cm) | Minimum Value of Resistivity (ohm cm) | Variation in Resistivity in Direction of Axis (%) |
|---|---|---|---|---|---|
| Initial Si Melt | As/B | Ga/B | Range of Solidified Fraction: 0-0.9 | | |
| $3.08 \times 10^{15}$ | 0.60 | 3.1 | 7.0 | 6.4 | 8.0 |
| $3.16 \times 10^{15}$ | 0.70 | 4.8 | 7.0 | 6.5 | 7.0 |
| $3.40 \times 10^{15}$ | 0.90 | 7.0 | 8.0 | 6.8 | 15.2 |
| $4.59 \times 10^{14}$ | 0.90 | 7.8 | 51.7 | 48.0 | 7.1 |
| $4.57 \times 10^{14}$ | 0.90 | 8.2 | 50.0 | 47.5 | 5.0 |
| $4.54 \times 10^{14}$ | 0.90 | 8.7 | 50.0 | 46.4 | 7.2 |
| $4.49 \times 10^{14}$ | 0.90 | 9.4 | 50.0 | 43.1 | 13.8 |
| $2.49 \times 10^{14}$ | 1.20 | 13.3 | 100.2 | 98.3 | 1.8 |
| $2.57 \times 10^{14}$ | 1.30 | 13.5 | 127.2 | 102.2 | 19.7 |
| $2.57 \times 10^{14}$ | 1.30 | 14.4 | 109.0 | 100.4 | 7.9 |
| $2.57 \times 10^{14}$ | 1.30 | 14.9 | 102.5 | 99.3 | 3.2 |
| $2.57 \times 10^{14}$ | 1.30 | 15.5 | 99.1 | 91.4 | 7.7 |
| $1.69 \times 10^{14}$ | 1.30 | 16.0 | 150.0 | 130.3 | 13.1 |
| $1.83 \times 10^{14}$ | 1.50 | 18.3 | 160.3 | 150.0 | 6.4 |
| $1.90 \times 10^{14}$ | 1.60 | 19.9 | 165.4 | 150.0 | 9.3 |

TABLE 6

| B Concentration (atoms/cm³) | Dopant Ratio (Initial Si Melt) | | Maximum Value of Resistivity (ohm cm) | Minimum Value of Resistivity (ohm cm) | Variation in Resistivity in Direction of Axis (%) |
|---|---|---|---|---|---|
| Initial Si Melt | As/B | In/B | Range of Solidified Fraction: 0-0.9 | | |
| $3.01 \times 10^{15}$ | 0.50 | 24.4 | 7.0 | 6.4 | 8.5 |
| $3.09 \times 10^{15}$ | 0.60 | 57.9 | 7.0 | 6.5 | 7.6 |
| $3.40 \times 10^{15}$ | 0.90 | 140.0 | 7.9 | 6.8 | 13.7 |
| $4.61 \times 10^{14}$ | 0.90 | 152.0 | 52.0 | 48.1 | 7.5 |
| $4.59 \times 10^{14}$ | 0.90 | 158.1 | 50.0 | 47.8 | 4.5 |
| $4.54 \times 10^{14}$ | 0.90 | 172.0 | 50.0 | 46.1 | 7.9 |
| $2.24 \times 10^{14}$ | 0.90 | 186.0 | 100.0 | 85.4 | 14.6 |
| $2.42 \times 10^{14}$ | 1.10 | 226.6 | 100.0 | 97.6 | 2.4 |
| $2.64 \times 10^{14}$ | 1.30 | 265.0 | 124.3 | 100.0 | 19.6 |
| $2.60 \times 10^{14}$ | 1.30 | 283.0 | 108.1 | 99.7 | 7.8 |
| $2.59 \times 10^{14}$ | 1.30 | 292.2 | 103.0 | 99.4 | 3.5 |
| $2.56 \times 10^{14}$ | 1.30 | 304.0 | 100.0 | 92.2 | 7.7 |
| $1.69 \times 10^{14}$ | 1.30 | 315.0 | 150.0 | 129.3 | 13.8 |
| $1.78 \times 10^{14}$ | 1.40 | 324.0 | 158.5 | 149.8 | 5.5 |
| $1.91 \times 10^{14}$ | 1.60 | 391.6 | 165.7 | 150.0 | 9.5 |

Table 5 shows results of simulation of a maximum value and a minimum value of resistivity and variation in resistivity in a direction of axis-of-growth of the silicon single crystals when a value calculated by dividing the concentration of the first sub-dopant in the silicon melt by the concentration of the main dopant in the silicon melt (the first concentration ratio) is varied in a range not lower than approximately 0.6 and not higher than approximately 1.6 and a value calculated by dividing the concentration of the second sub-dopant in the silicon melt by the concentration of the main dopant in the silicon melt (the second concentration ratio) is varied in a range not lower than approximately 3.1 and not higher than approximately 19.9 in the case where boron (B), arsenic (As), and gallium (Ga) are employed as the main dopant, the first sub-dopant, and the second sub-dopant to be added to the silicon melt, respectively. The boron concentration in this case is not lower than approximately $1.69 \times 10^{14}$ atoms/cm³ and not higher than approximately $3.40 \times 10^{15}$ atoms/cm³.

In this case, a p-type silicon single crystal can be obtained in which the maximum value of resistivity is not lower than approximately 7.0 Ωcm and not higher than approximately 165.4 Ωcm, the minimum value of resistivity is not lower than approximately 6.4 Ωcm and not higher than approximately 150.0 Ωcm, and the variation in resistivity in the direction of the axis of growth is not higher than approximately 19.7%.

More preferably, a value calculated by dividing the concentration of the first sub-dopant in the silicon melt by the concentration of the main dopant in the silicon melt (the first concentration ratio) is in a range not lower than approximately 0.6 and not higher than approximately 1.5 and a value calculated by dividing the concentration of the second sub-dopant in the silicon melt by the concentration of the main dopant in the silicon melt (the second concentration ratio) is in a range not lower than approximately 3.1 and not higher than approximately 18.3. The boron concentration in this case is not lower than approximately $1.69 \times 10^{14}$ atoms/cm³ and not higher than approximately $3.40 \times 10^{15}$ atoms/cm³.

In this case, a p-type silicon single crystal can be obtained in which the maximum value of resistivity is not lower than approximately 7.0 Ωcm and not higher than approximately 160.3 Ωcm, the minimum value of resistivity is not lower than approximately 6.5 Ωcm and not higher than approximately 150.0 Ωcm, and the variation in resistivity in the direction of axis of growth is not higher than approximately 19.7%.

Table 6 shows results of simulation of a maximum value and a minimum value of resistivity and variation in resistivity in the direction of axis-of-growth of the silicon single crystals when a value calculated by dividing the concentration of the first sub-dopant in the silicon melt by the concentration of the main dopant in the silicon melt (the first concentration ratio) is varied in a range not lower than approximately 0.5 and not higher than approximately 1.6 and a value calculated by dividing the concentration of the second sub-dopant in the silicon melt by the concentration of the main dopant in the silicon melt (the second concentration ratio) is varied in a range not lower than approximately 24.4 and not higher than approximately 391.6 in the case where boron (B), arsenic (As), and indium (In) are employed as the main dopant, the first sub-dopant, and the second sub-dopant to be added to the silicon melt, respectively. The boron concentration in this case is not lower than approximately $1.69 \times 10^{14}$ atoms/cm³ and not higher than approximately $3.40 \times 10^{15}$ atoms/cm³.

In this case, a p-type silicon single crystal can be obtained in which the maximum value of resistivity is not lower than approximately 7.0 Ωcm and not higher than approximately 165.7 Ωcm, the minimum value of resistivity is not lower than approximately 6.4 Ωcm and not higher than approximately 150.0 Ωcm, and the variation in resistivity in the direction of the axis of growth is not higher than approximately 19.6%.

More preferably, a value calculated by dividing the concentration of the first sub-dopant in the silicon melt by the concentration of the main dopant in the silicon melt (the first concentration ratio) is in a range not lower than approximately 0.6 and not higher than approximately 1.4 and a value calculated by dividing the concentration of the second sub-dopant in the silicon melt by the concentration of the main dopant in the silicon melt (the second concentration ratio) is in a range not lower than approximately 57.9 and not higher than approximately 324.0. The boron concentration in this case is not lower than approximately $1.69 \times 10^{14}$ atoms/cm³ and not higher than approximately $3.40 \times 10^{15}$ atoms/cm³.

In this case, a p-type silicon single crystal can be obtained in which the maximum value of resistivity is not lower than approximately 7.0 Ωcm and not higher than approximately 158.5 Ωcm, the minimum value of resistivity is not lower than approximately 6.5 Ωcm and not higher than approximately 149.8 Ωcm, and the variation in resistivity in the direction of the axis of growth is not higher than approximately 19.6%.

As described above, the p-type silicon single crystal grown with the Czochralski method from the initial silicon melt to which boron (the main dopant), the first sub-dopant which is an n-type impurity and smaller in segregation coefficient than boron, and the second sub-dopant which is a p-type impurity and smaller in segregation coefficient than the first sub-dopant have been added contains boron (the main dopant), the first sub-dopant which is an n-type impurity and smaller in segregation coefficient than boron, and the second sub-dopant which is a p-type impurity and smaller in segregation coefficient than the first sub-dopant. Then, on condition that the first concentration ratio calculated by dividing the concentration of the first sub-dopant in the silicon melt by the concentration of the main dopant in the silicon melt and the second concentration ratio calculated by dividing the concentration of the second sub-dopant in the silicon melt by the concentration of the main dopant in the silicon melt are in the ranges described in the first to sixth embodiments, the p-type silicon single crystal containing the main dopant, the first sub-dopant, and the second sub-dopant at the first concentration ratio and the second concentration ratio in that range can be obtained.

A method of measuring the concentration of a dopant contained in the silicon single crystal 1 will now be described. Concentration of an element such as boron, phosphorus, aluminum, gallium, indium, and arsenic as a dopant in silicon single crystal 1 can be measured with such a known method as SIMS (Secondary Ion Mass Spectroscopy).

It should be understood that the embodiments disclosed herein are illustrative and non-restrictive in every respect. The scope of the present invention is defined by the terms of the claims, rather than the embodiments and examples above, and is intended to include any modifications within the scope and meaning equivalent to the terms of the claims. The numerical values and ranges in the claims should be construed to include minor excursions from the numerical values.

What is claimed is:

1. A method of manufacturing a p-type silicon single crystal, comprising the steps of:
   preparing a silicon melt to which boron as a main dopant, a first sub-dopant which is an n-type impurity with a smaller segregation coefficient than boron, and a second sub-dopant which is a p-type impurity with a smaller segregation coefficient than the first sub-dopant are added; and
   growing a silicon single crystal having resistivity not lower than 6 Ωcm from the silicon melt by the Czochralski method.

2. The method of manufacturing a p-type silicon single crystal of claim 1, wherein
   the first sub-dopant is phosphorus and the second sub-dopant is aluminum, and
   a first concentration ratio calculated by dividing the concentration of the first sub-dopant in the silicon melt by the concentration of the main dopant in the silicon melt is not lower than 0.5 and not higher than 1.2 and a second concentration ratio calculated by dividing the concentration of the second sub-dopant in the silicon melt by the concentration of the main dopant in the silicon melt is not lower than 4.9 and not higher than 52.4.

3. The method of manufacturing a p-type silicon single crystal of claim 1, wherein
   the first sub-dopant is phosphorus and the second sub-dopant is gallium, and
   a first concentration ratio calculated by dividing the concentration of the first sub-dopant in the silicon melt by the concentration of the main dopant in the silicon melt is not lower than 0.5 and not higher than 1.2 and a second concentration ratio calculated by dividing the concentration of the second sub-dopant in the silicon melt by the concentration of the main dopant in the silicon melt is not lower than 1.2 and not higher than 13.4.

4. The method of manufacturing a p-type silicon single crystal of claim 1, wherein
   the first sub-dopant is phosphorus and the second sub-dopant is indium, and
   a first concentration ratio calculated by dividing the concentration of the first sub-dopant in the silicon melt by the concentration of the main dopant in the silicon melt is not lower than 0.5 and not higher than 1.2 and a second concentration ratio calculated by dividing the concentration of the second sub-dopant in the silicon melt by the concentration of the main dopant in the silicon melt is not lower than 25.1 and not higher than 261.2.

5. The method of manufacturing a p-type silicon single crystal of claim 1, wherein
   the first sub-dopant is arsenic and the second sub-dopant is aluminum, and
   a first concentration ratio calculated by dividing the concentration of the first sub-dopant in the silicon melt by the concentration of the main dopant in the silicon melt is not lower than 0.6 and not higher than 1.5 and a second concentration ratio calculated by dividing the concentration of the second sub-dopant in the silicon melt by the concentration of the main dopant in the silicon melt is not lower than 11.7 and not higher than 72.2.

6. The method of manufacturing a p-type silicon single crystal of claim 1, wherein
   the first sub-dopant is arsenic and the second sub-dopant is gallium, and
   a first concentration ratio calculated by dividing the concentration of the first sub-dopant in the silicon melt by the concentration of the main dopant in the silicon melt is not lower than 0.6 and not higher than 1.5 and a second concentration ratio calculated by dividing the concentration of the second sub-dopant in the silicon melt by the concentration of the main dopant in the silicon melt is not lower than 3.1 and not higher than 18.3.

7. The method of manufacturing a p-type silicon single crystal of claim 1, wherein
   the first sub-dopant is arsenic and the second sub-dopant is indium, and
   a first concentration ratio calculated by dividing the concentration of the first sub-dopant in the silicon melt by the concentration of the main dopant in the silicon melt is not lower than 0.6 and not higher than 1.4 and a second concentration ratio calculated by dividing the concentration of the second sub-dopant in the silicon melt by the concentration of the main dopant in the silicon melt is not lower than 57.9 and not higher than 324.0.

8. The method of manufacturing a p-type silicon single crystal of claim 1, wherein
   the first sub-dopant is phosphorus and the second sub-dopant is aluminum, and
   a first concentration ratio calculated by dividing the concentration of the first sub-dopant in the silicon melt by the concentration of the main dopant in the silicon melt is not lower than 0.79 and not higher than 0.81 and a second concentration ratio calculated by dividing the concentration of the second sub-dopant in the silicon melt by the concentration of the main dopant in the silicon melt is not lower than 24.2 and not higher than 27.0.

9. The method of manufacturing a p-type silicon single crystal of claim 1, wherein the first sub-dopant is phosphorus and the second sub-dopant is aluminum, and a first concentration ratio calculated by dividing the concentration of the first sub-dopant in the silicon melt by the concentration of the main dopant in the silicon melt is not lower than 0.89 and not higher than 0.91 and a second concentration ratio calculated by dividing the concentration of the second sub-dopant in the silicon melt by the concentration of the main dopant in the silicon melt is not lower than 30.8 and not higher than 33.8.

10. The method of manufacturing a p-type silicon single crystal of claim 1, wherein the first sub-dopant is phosphorus and the second sub-dopant is gallium, and a first concentration ratio calculated by dividing the concentration of the first sub-dopant in the silicon melt by the concentration of the main dopant in the silicon melt is not lower than 0.79 and not higher than 0.81 and a second concentration ratio calculated by dividing the concentration of the second sub-dopant in the silicon melt by the concentration of the main dopant in the silicon melt is not lower than 6.2 and not higher than 6.9.

11. The method of manufacturing a p-type silicon single crystal of claim 1, wherein the first sub-dopant is phosphorus and the second sub-dopant is gallium, and a first concentration ratio calculated by dividing the concentration of the first sub-dopant in the silicon melt by the concentration of the main dopant in the silicon melt is not lower than 0.89 and not higher than 0.91 and a second concentration ratio calculated by dividing the concentration of the second sub-dopant in the silicon melt by the concentration of the main dopant in the silicon melt is not lower than 7.8 and not higher than 8.5.

12. A p-type silicon single crystal which is grown from a silicon melt by the method of claim 1, comprising:

boron as a main dopant;

a first sub-dopant which is an n-type impurity and smaller in segregation coefficient than the boron; and a second sub-dopant which is a p-type impurity and smaller in segregation coefficient than the first sub-dopant, the p-type silicon single crystal having a resistivity which is not lower than 6 Ωcm.

13. The p-type silicon single crystal of claim 12, wherein the first sub-dopant is phosphorus and the second sub-dopant is aluminum, and a first concentration ratio calculated by dividing the concentration of the first sub-dopant in the silicon melt by the concentration of the main dopant in the silicon melt is not lower than 0.5 and not higher than 1.2 and a second concentration ratio calculated by dividing the concentration of the second sub-dopant in the silicon melt by the concentration of the main dopant in the silicon melt is not lower than 4.9 and not higher than 52.4.

14. The p-type silicon single crystal of claim 12, wherein the first sub-dopant is phosphorus and the second sub-dopant is gallium, and a first concentration ratio calculated by dividing the concentration of the first sub-dopant in the silicon melt by the concentration of the main dopant in the silicon melt is not lower than 0.5 and not higher than 1.2 and a second concentration ratio calculated by dividing the concentration of the second sub-dopant in the silicon melt by the concentration of the main dopant in the silicon melt is not lower than 1.2 and not higher than 13.4.

15. The p-type silicon single crystal of claim 12, wherein the first sub-dopant is phosphorus and the second sub-dopant is indium, and a first concentration ratio calculated by dividing the concentration of the first sub-dopant in the silicon melt by the concentration of the main dopant in the silicon melt is not lower than 0.5 and not higher than 1.2 and a second concentration ratio calculated by dividing the concentration of the second sub-dopant in the silicon melt by the concentration of the main dopant in the silicon melt is not lower than 25.1 and not higher than 261.2.

16. The p-type silicon single crystal of claim 12, wherein the first sub-dopant is arsenic and the second sub-dopant is aluminum, and a first concentration ratio calculated by dividing the concentration of the first sub-dopant in the silicon melt by the concentration of the main dopant in the silicon melt is not lower than 0.6 and not higher than 1.5 and a second concentration ratio calculated by dividing the concentration of the second sub-dopant in the silicon melt by the concentration of the main dopant in the silicon melt is not lower than 11.7 and not higher than 72.2.

17. The p-type silicon single crystal of claim 12, wherein the first sub-dopant is arsenic and the second sub-dopant is gallium, and a first concentration ratio calculated by dividing the concentration of the first sub-dopant in the silicon melt by the concentration of the main dopant in the silicon melt is not lower than 0.6 and not higher than 1.5 and a second concentration ratio calculated by dividing the concentration of the second sub-dopant in the silicon melt by the concentration of the main dopant in the silicon melt is not lower than 3.1 and not higher than 18.3.

18. The p-type silicon single crystal of claim 12, wherein the first sub-dopant is arsenic and the second sub-dopant is indium, and a first concentration ratio calculated by dividing the concentration of the first sub-dopant in the silicon melt by the concentration of the main dopant in the silicon melt is not lower than 0.6 and not higher than 1.4 and a second concentration ratio calculated by dividing the concentration of the second sub-dopant in the silicon melt by the concentration of the main dopant in the silicon melt is not lower than 57.9 and not higher than 324.0.

19. The p-type silicon single crystal of claim 12, wherein the first sub-dopant is phosphorus and the second sub-dopant is aluminum, and a first concentration ratio calculated by dividing the concentration of the first sub-dopant in the silicon melt by the concentration of the main dopant in the silicon melt is not lower than 0.79 and not higher than 0.81 and a second concentration ratio calculated by dividing the concentration of the second sub-dopant in the silicon melt by the concentration of the main dopant in the silicon melt is not lower than 24.2 and not higher than 27.0.

20. The p-type silicon single crystal of claim 12, wherein the first sub-dopant is phosphorus and the second sub-dopant is aluminum, and a first concentration ratio calculated by dividing the concentration of the first sub-dopant in the silicon melt by the concentration of the main dopant in the silicon melt is not lower than 0.89 and not higher than 0.91 and a second concentration ratio calculated by dividing the concentration of the second sub-dopant in the silicon melt by the concentration of the main dopant in the silicon melt is not lower than 30.8 and not higher than 33.8.

21. The p-type silicon single crystal of claim 12, wherein the first sub-dopant is phosphorus and the second sub-dopant is gallium, and a first concentration ratio calculated by dividing the concentration of the first sub-dopant in the silicon melt by the concentration of the main dopant in the silicon melt is not lower than 0.79 and not higher than 0.81 and a second concentration ratio calculated by dividing the concentration of the second sub-dopant in the silicon melt by the concentration of the main dopant in the silicon melt is not lower than 6.2 and not higher than 6.9.

22. The p-type silicon single crystal of claim 12, wherein the first sub-dopant is phosphorus and the second sub-dopant is gallium, and a first concentration ratio calculated by dividing the concentration of the first sub-dopant in the silicon melt by the concentration of the main dopant in the silicon melt is not lower than 0.89 and not higher than 0.91 and a second concentration ratio calculated by dividing the concentration of the second sub-dopant in the silicon melt by the concentration of the main dopant in the silicon melt is not lower than 7.8 and not higher than 8.5.

23. A silicon wafer obtained by slicing a p-type silicon single crystal of claim 12.

* * * * *